(12) United States Patent
Yabe (10) Patent No.: US 6,661,279 B2
(45) Date of Patent: Dec. 9, 2003

(54) SEMICONDUCTOR INTEGRATED CIRCUIT WHICH OUTPUTS FIRST INTERNAL POWER SUPPLY VOLTAGE AND SECOND INTERNAL POWER SUPPLY VOLTAGE LOWER THAN FIRST INTERNAL SUPPLY POWER VOLTAGE

(75) Inventor: Tomoaki Yabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/101,729

(22) Filed: Mar. 21, 2002

(65) Prior Publication Data

US 2002/0149036 A1 Oct. 17, 2002

(30) Foreign Application Priority Data

Apr. 11, 2001 (JP) ........................................ 2001-112463

(51) Int. Cl.[7] .................................................. G05F 1/10
(52) U.S. Cl. ........................ 327/546; 327/541; 327/543; 323/316
(58) Field of Search ................................. 327/538, 540, 327/541, 543, 545, 546; 323/313, 316; 365/220

(56) References Cited

U.S. PATENT DOCUMENTS

| 4,683,382 | A | * | 7/1987 | Sakurai et al. ............... 327/544 |
| 5,249,155 | A | * | 9/1993 | Arimoto et al. ............. 365/222 |
| 5,280,455 | A | * | 1/1994 | Kanaishi ...................... 365/229 |
| 5,352,935 | A | * | 10/1994 | Yamamura et al. .......... 327/540 |
| 5,493,234 | A | * | 2/1996 | Oh ................................ 326/33 |
| 5,554,953 | A | * | 9/1996 | Shibayama et al. .......... 327/541 |
| 6,064,188 | A | * | 5/2000 | Takashima et al. .......... 323/316 |
| 6,184,744 | B1 | * | 2/2001 | Morishita ..................... 327/541 |
| 6,313,694 | B1 | * | 11/2001 | Sohn ............................ 327/541 |

OTHER PUBLICATIONS

Takayuki Ootani, et al. "A 4–Mb CMOS SRAM With a PMOS Thin–Film–Transistor Load Cell" IEEE Journal of Solid–State Circuits, vol. 25, No. 5, Oct. 1990, pp. 1082–1092.

* cited by examiner

*Primary Examiner*—Terry D. Cunningham
(74) *Attorney, Agent, or Firm*—Oblon, Spivak, McClelland, Maier & Neustadt, P.C.

(57) ABSTRACT

A semiconductor integrated circuit comprises a power supply voltage step down circuit and a MOS circuit group. The power supply voltage step down circuit is supplied with a power supply voltage and controlled by a standby control signal indicating an operating state or a standby state. The power supply voltage step down circuit outputs a first internal power supply voltage lower than the power supply voltage to an internal power supply line when the standby control signal indicates the operating state, and outputs a second internal power supply voltage lower than the first internal power supply voltage to the internal power supply line when the standby control signal indicates the standby state. The MOS circuit group including one or more MOS transistors which are supplied with the first or second internal power supply voltage from the internal power supply line to operate.

15 Claims, 7 Drawing Sheets

SEMICONDUCTOR INTEGRATED CIRCUIT WHICH OUTPUTS FIRST INTERNAL POWER SUPPLY VOLTAGE AND SECOND INTERNAL POWER SUPPLY VOLTAGE LOWER THAN FIRST INTERNAL SUPPLY POWER VOLTAGE

CROSS REFERENCE TO RELATED APPLICATION

This application claims benefit of priority under 35 U.S.C. §119 to Japanese Patent Application No. 2001-112463, filed on Apr. 11, 2001, the entire contents of which are incorporated by reference herein.

BACKGROUND OF THE INVENTION

1. Field of the Invention

The present invention relates to a semiconductor integrated circuit in which an internal power supply voltage different from an external power supply voltage is used, and more particularly to a semiconductor integrated circuit within which a voltage lower than that of an external power supply is used.

2. Description of the Related Art

Figure 5:
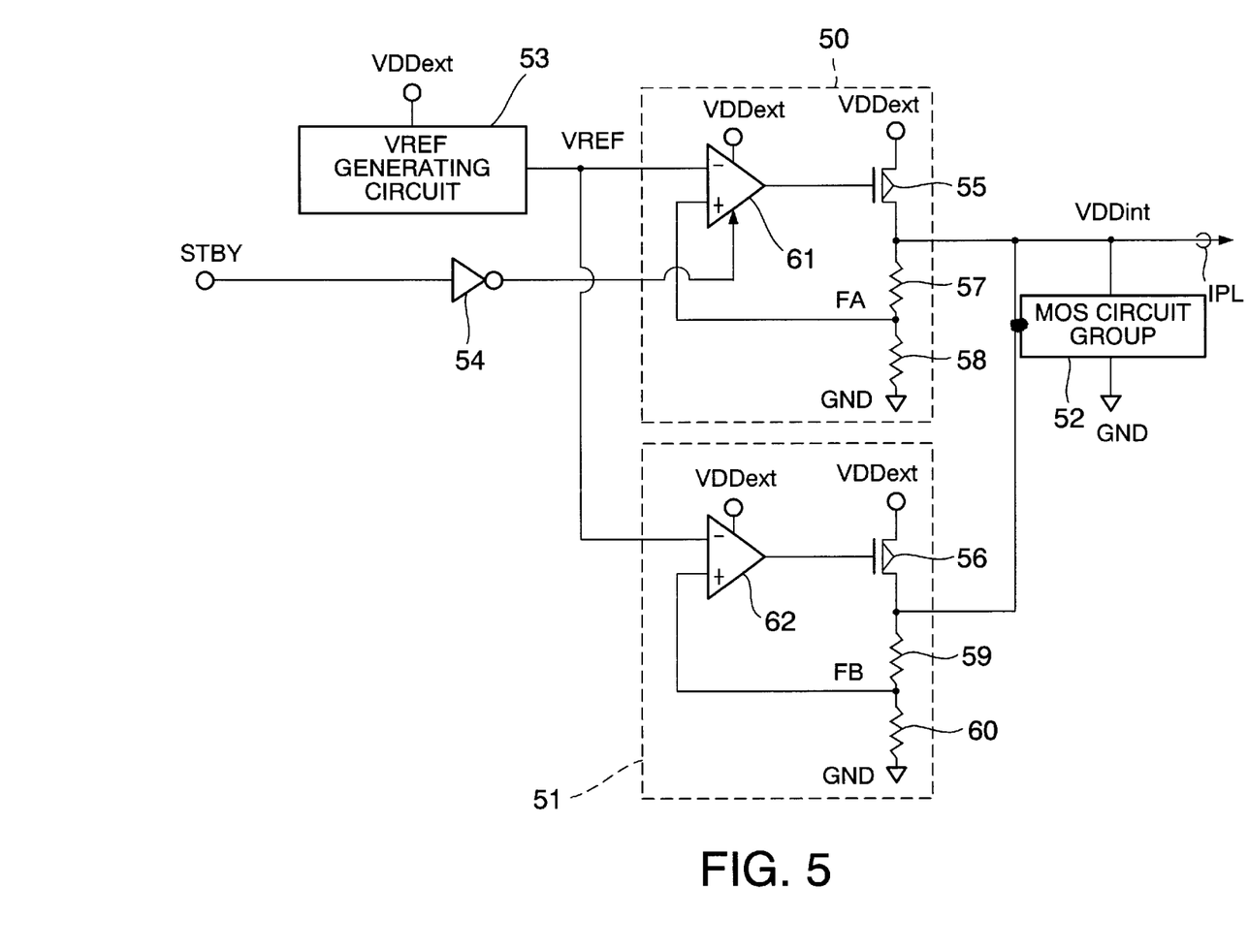
FIG. 5 is a circuit diagram showing a related semiconductor integrated circuit.

As for a related semiconductor integrated circuit, a technique of stepping down a voltage supplied from the outside to generate an internal voltage and using the internal voltage as an operating voltage of a MOS transistor is used for a semiconductor integrated circuit having a microstructural MOS transistor. FIG. 5 shows the configuration of the periphery of a power supply voltage step down circuit of the related semiconductor integrated circuit.

An operating power supply voltage step down circuit 50, a standby power supply voltage step down circuit 51, a MOS circuit group 52, a VREF generating circuit 53, and a buffer 54 are provided here.

The power supply voltage step down circuits each receive an external power supply voltage VDDext supplied to a chip, generates an internal power supply voltage VDDint lower than the external power supply voltage VDDext, and supplies it to the MOS circuit group 52 via an internal power supply line IPL in the chip. The MOS circuit group 52 includes one or more MOS transistors, and, for example, it corresponds to a common CMOS circuit such as an inverter circuit or a NAND circuit, a memory cell, and the like.

The external power supply voltage VDDext differs depending on tip specifications of a semiconductor integrated circuit. For example, approximately 2.5 V or 1.8 V is used. In addition, the internal power sully voltage VDDint differs depending on the design rule or the like of a semiconductor integrated circuit. For example, approximately 1.2 V is used in a semiconductor integrated circuit having a 0.1 µm rule.

An operating state or a standby state of the chip is selected by a standby control signal STBY which is supplied from the outside of the chip to indicate the standby state. Namely, when the standby control signal STBY is at a low level, the operating state is selected, and when the standby control signal STBY is at a high level, the standby state is selected.

The operating/standby power supply voltage step down circuits 50 and 51 respectively have output P-type MOS transistors 55 and 56, resistance elements 57 and 58, and 59 and 60 for resistively dividing the internal power supply voltage VDDint, and the first operational amplifier 61 and the second operational amplifier 62.

The first operational amplifier 61 and the second operational amplifier 62 respectively perform feedback control for the output P-type MOS transistors 55 and 56 in such a manner that the potentials of nodes FA and FB obtained by resistively dividing the internal power supply voltage VDDint are equalized to VREF, and hence the fixed internal power supply voltage VDDint is outputted irrespective of the level of the external power supply voltage VDDext.

In the operating/standby power supply voltage step down circuits 50 and 51, the internal power supply voltage VDDint which is outputted to the internal power supply line IPL is set by using resistance division and the operational amplifiers 61 and 62. In other words, in the operating/standby power supply voltage step down circuits 50 and 51, the potential that the internal power supply voltage VDDint is resistively divided is applied to plus input terminals of the operational amplifiers 61 and 62, and an output of the VREF generating circuit 53 is applied to minus input terminals of the operational amplifiers 61 and 62.

The operating power supply voltage step down circuit 50 has large current driving force for the internal power supply voltage VDDint, but on the other hand, the current consumption of the voltage step down circuit itself is large. Since it is required to hold down the current consumption of the entire chip in the standby state, the operating power supply voltage step down circuit 50 is stopped by the standby control signal STBY, and only the standby power supply voltage step down circuit 51 is operated. In the standby voltage step down circuit 51, the MOS circuit group 52 to which the internal power supply voltage VDDint is supplied is stopped in the standby state, whereby only small current driving force is required, resulting in a small current consumption of the voltage step down circuit itself. The operating/standby power supply voltage step down circuits 50 and 51 generate the internal power supply voltage VDDint having the same potential based on the reference voltage VREF. Namely, the internal power supply voltage VDDint outputted from the operating power supply voltage step down circuit 50 to the internal power supply voltage line IPL is the same as the internal power supply voltage VDDint outputted from the standby power supply voltage step down circuit 51 to the internal power supply voltage line IPL. It should be mentioned that both the operating power supply voltage step down circuit 50 and the standby power supply step down circuit 51 are operating in the operating state.

In the related semiconductor integrated circuit described above, there arises the following problem.

As the scale-down of a transistor used in a semiconductor integrated circuit advances and a gate insulating film of the MOS transistor becomes thinner, recently a gate leakage current of the MOS transistor has been given a great deal of attention as an obstacle to a reduction in the standby current of a chip.

For example, in a design rule of 0.15 µm, the thickness of the gate insulating film is approximately 3.5 µm. In a design rule of 0.1 µm, the thickness of the gate insulating film is approximately 2 µm. In the design rule of 0.15 µm, the gate leakage current does not matter, but in the design rule of 0.1 µm, a reduction in gate leakage current is needed.

Figure 6:
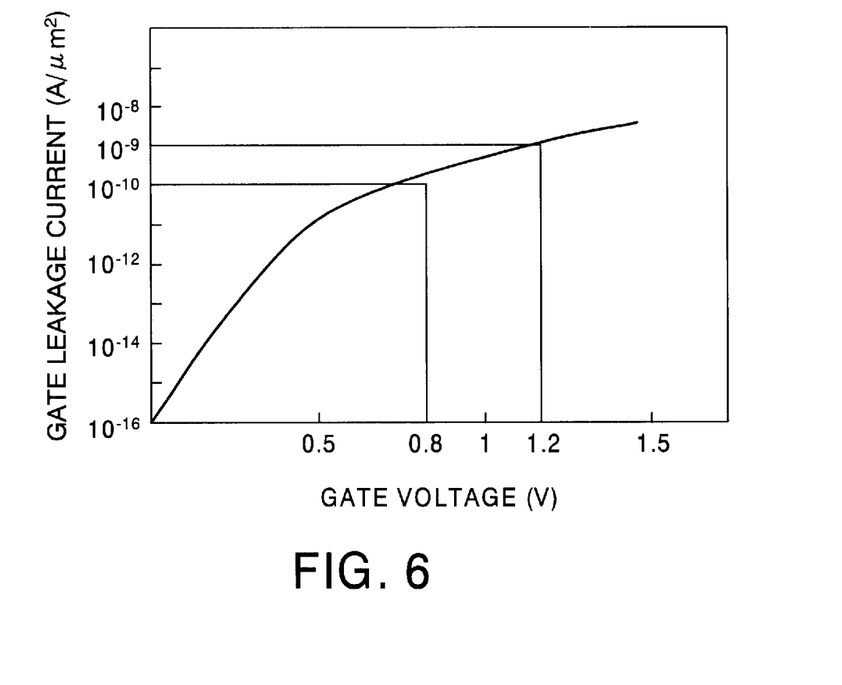
FIG. 6 is a current-voltage characteristic diagram showing gate voltage dependence of a gate leakage current.
Figure 7:
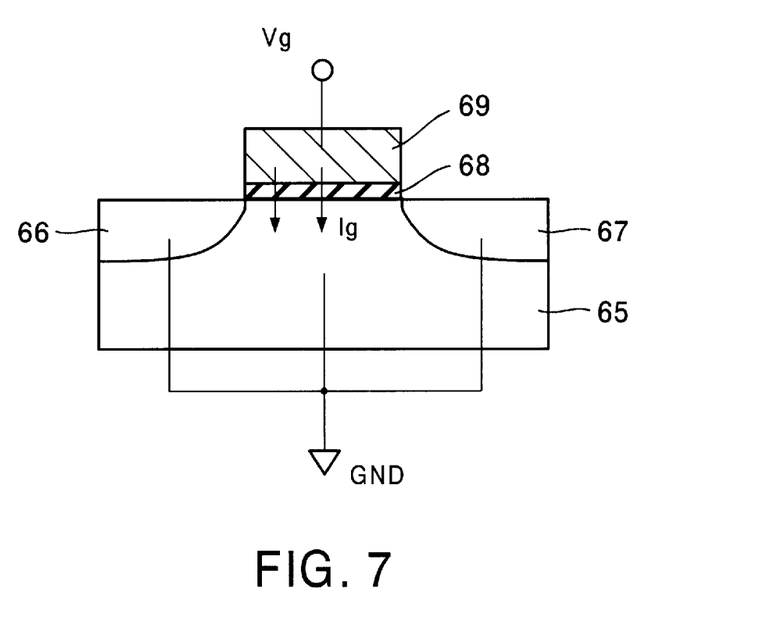
FIG. 7 is a diagram showing a method for measuring the gate leakage current in FIG. 6.

Now, a voltage-current characteristic of the gate leakage current of the MOS transistor in the generation of the design rule of 0.1 µm is shown in FIG. 6. As shown in FIG. 7A, a semiconductor substrate 65, a source 66, a drain 67 and a gate electrode 69 of a MOS transistor are connected in order to constitute a MOS capacitor, and then as shown in FIG. 6, a gate leakage current (a current flowing from the gate electrode 69 to the substrate 65 through a gate insulating film 68) Ig per unit gate area is graphed by varying the gate voltage of the MOS capacitor. In FIG. 7, the same ground potential is applied to the semiconductor substrate 65, the source 66, and the drain 67.

The gate electrode 69 is formed on the semiconductor substrate 65 with a gate insulating film 68 therebetween, and a gate voltage Vg is applied to the gate electrode 69. The result of the measurements of the gate leakage current Ig flowing from the gate electrode 69 to the semiconductor substrate 65 in such a state is shown in FIG. 6.

Since the MOS transistor in the generation of the design rule of 0.1 $\mu$m operates at a power supply voltage of 1.2 V, as can be seen from FIG. 6, the gate leakage current in this case is 1 nA per 1 $\mu m^2$ gate oxide film.

For example, the total gate area of a 36 Mbit low power consumption SRAM chip in this generation is 100 K$\mu m^2$ order, and hence the gate leakage current of the entire chip reaches 100 $\mu$A. Since the standby current specification of the low power consumption SRAM chip is usually not more than 100 $\mu$A, it becomes difficult to satisfy the standby current specification by only the gate leakage current in this generation. Moreover, due to ununiformity of processes or the like, gate insulating films formed in respective chips are different in thickness, and the magnitude of their gate leakage currents are different in some cases, whereby some chips which satisfy the standby current specification and other chips which does not satisfy the same are manufactured mixedly.

Incidentally, although it is possible to satisfy the standby current specification by preparing a lower external voltage, in this case, a potential different from that of an ordinary power supply needs to be provided outside the semiconductor chip, resulting in the complication of a system configuration into which the semiconductor integrated circuit is incorporated.

As stated above, in the related example in which the internal power supply voltage VDDint is supplied into the chip in the standby state at the same level as in the operating state, there is a problem that with the advance of the scale-down of the MOS transistor, it becomes difficult to suppress the standby current due to the gate leakage current.

SUMMARY OF THE INVENTION

According to one aspect of the present invention, a semiconductor integrated circuit comprising:

a power supply voltage step down circuit which is supplied with a power supply voltage and controlled by a standby control signal indicating an operating state or a standby state, wherein the power supply voltage step down circuit outputs a first internal power supply voltage lower than the power supply voltage to an internal power supply line when the standby control signal indicates the operating state, and the power supply voltage step down circuit outputs a second internal power supply voltage lower than the first internal power supply voltage to the internal power supply line when the standby control signal indicates the standby state; and a MOS circuit group including one or more MOS transistors which are supplied with the first internal power supply voltage or the second internal power supply voltage from the internal power supply line to operate.

According to another aspect of the present invention, a semiconductor integrated circuit comprising:

a power supply voltage step down circuit which is supplied with a power supply voltage and which outputs an internal power supply voltage lower than the power supply voltage to an internal power supply line; and a MOS circuit group including one or more MOS transistors which are supplied with the internal power supply voltage from the internal power supply line to operate, wherein the power supply voltage step down circuit estimates an amount of gate leakage currents flowing in the MOS circuit group and lowers the internal power supply voltage as the estimated amount of the gate leakage currents becomes large.

DETAILED DESCRIPTION OF THE EMBODIMENTS

Some embodiments will be explained below with reference to the drawings. In the following description of the drawings, the same or similar numerals and symbols will be given to the same or similar portions.

First Embodiment

A semiconductor integrated circuit according to the first embodiment will be explained by means of FIG. 1 to FIG. 3B.

Figure 1:
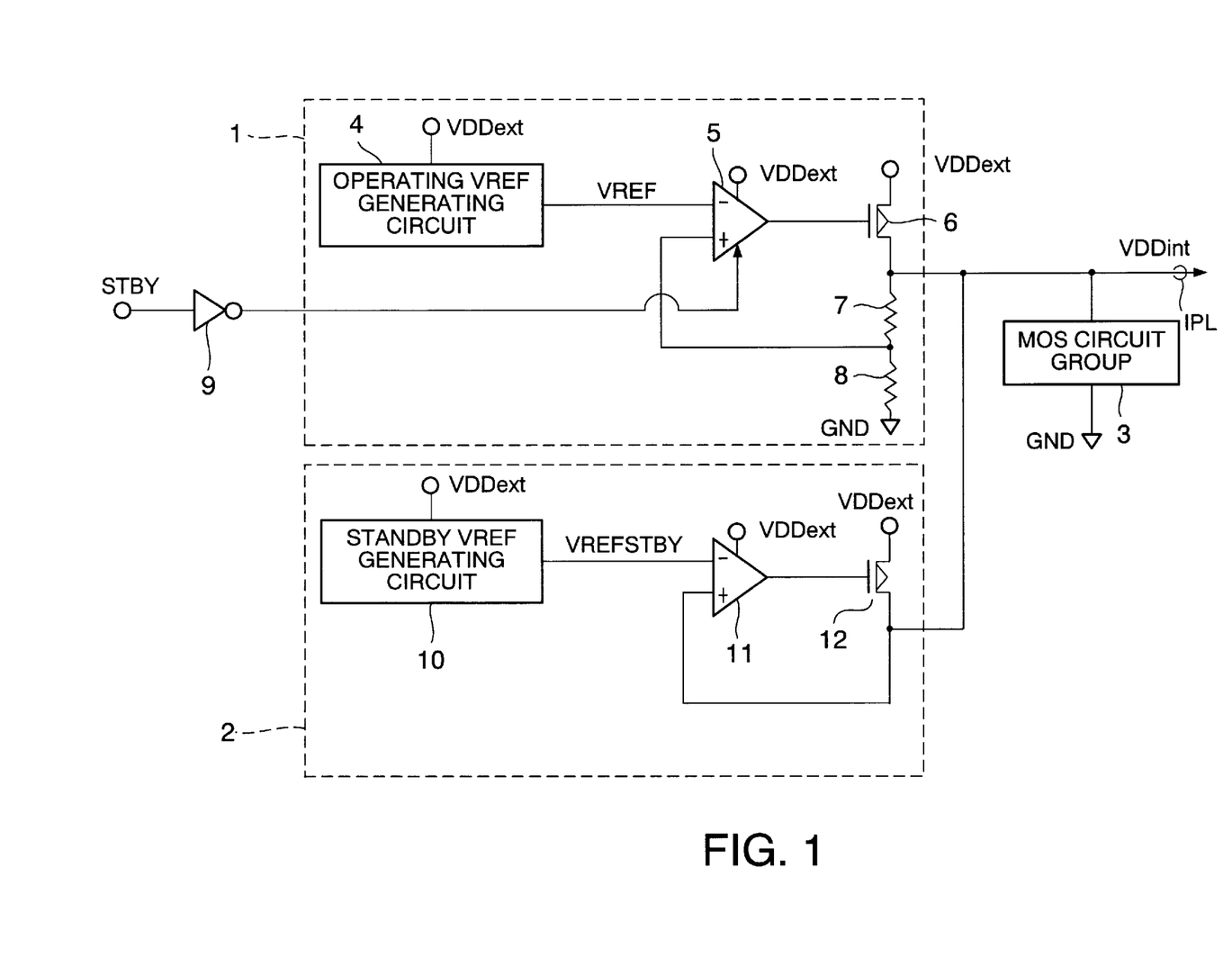
FIG. 1 is a circuit diagram showing a semiconductor integrated circuit of a first embodiment.

FIG. 1 is a block diagram of the semiconductor integrated circuit of this embodiment. In this case, each of an operating power supply voltage step down circuit 1 and a standby power supply voltage step down circuit 2 supplies an internal power supply voltage VDDint to a MOS circuit group 3 via an internal power supply line IPL in the semiconductor integrated circuit. The MOS circuit group 3 includes one or more MOS transistors and the MOS circuit group 3 has such a configuration that the internal power supply line IPL for supplying the internal power supply voltage VDDint and a ground potential are connected. In other words, the MOS transistors in the MOS circuit group 3 are operated by the internal power supply voltage VDDint supplied from the internal power supply line IPL.

The MOS circuit group 3 may include one or more circuit elements other than the MOS transistors. In this embodiment, the internal power supply voltage VDDint from the internal power supply line IPL is supplied to a gate of at least a part of the MOS transistors. In addition, the internal power supply voltage VDDint is also supplied to a source and/or a drain of at least a part of the MOS transistors, as needed. Moreover, the internal power supply voltage VDDint may be supplied to the circuit elements provided as needed.

The operating power supply voltage step down circuit 1 includes an operating VREF generating circuit 4 to which an external power supply voltage VDDext is inputted; a first operational amplifier 5 to whose minus input terminal an output VREF of the operating VREF generating circuit 4 is inputted and to which the external power supply voltage VDDext is inputted; a first P-type MOS transistor 6 to which an output of the first operational amplifier 5 is inputted and to whose source the external power supply voltage VDDext is inputted; a first resistance element 7 whose one end is connected to a drain of the first P-type MOS transistor 6; and a second resistance element 8 whose one end is connected to the other end of the first resistance element 7 and whose other end is grounded.

A connection node between the first resistance element 7 and the second resistance element 8 is connected to a plus input terminal of the first operational amplifier 5. Further, a standby control signal STBY is inputted to the first operational amplifier 5 via a buffer 9 provided in the semiconductor integrated circuit. The buffer 9 is here composed of an inverter. In this embodiment, the standby control signal STBY is at a low level in an operating state, so that an output from the buffer 9 to the first operational amplifier 5 is at a high level. On the other hand, the standby control signal STBY is at the high level in a standby state, so that the output from the buffer 9 to the first operational amplifier 5 is at the low level.

A node between the drain of the first P-type MOS transistor 6 and the first resistance element 7 serves as an output node, and hence the operating power supply voltage step down circuit 1 supplies the internal power supply voltage VDDint to the MOS transistors of the MOS circuit group 3. However, when the output from the buffer 9 to the first operational amplifier 5 becomes the low level in the standby state, the output of the first operational amplifier 5 is fixed at the high level, and then the first P-type MOS transistor 6 turns off. As a result, there is no voltage output from the operating power supply voltage step down circuit 1 to the internal power supply line IPL.

The standby power supply voltage step down circuit 2 includes a standby VREF generating circuit 10 to which the external power supply voltage VDDext is inputted; a second operational amplifier 11 to whose minus input terminal a reference voltage VREFSTBY outputted from the standby VREF generating circuit 10 is inputted and to which the external power supply voltage VDDext is inputted; and a second P-type MOS transistor 12 to which an output of the second operational amplifier 11 is inputted and to whose source the external power supply voltage VDDext is inputted.

A drain of the second P-type MOS transistor 12 serves as an output node of the standby power supply voltage step down circuit 2, and the output node supplies the internal power supply voltage VDDint to the MOS transistors of the MOS circuit group 3 via the internal power supply line IPL. Moreover, the drain of the second P-type MOS transistor 12 is connected to a plus input terminal of the second operational amplifier 11.

As described above, a VREF generating circuit is separated into one used in the operating state and the other used in the standby state. And then, in the standby power supply voltage step down circuit 2, the standby VREF generating circuit 10 generates a potential of the internal power supply voltage VDDint, at which a gate leakage current is reduced to a desired value, as the reference voltage VREFSTBY and supplied it to the second operational amplifier 11 for feedback. That is, in this embodiment, the reference voltage VREFSTBY is predetermined, so it is fixed. Moreover, in the standby power supply voltage step down circuit 2, the internal power supply voltage VDDint together with the reference voltage VREFSTBY is inputted directly to the second operational amplifier 11 without being resistively divided, so that the internal power supply voltage VDDint is subjected to feedback control in such a manner to have the same potential as the reference voltage VREFSTBY.

In addition, in this embodiment, the "operating state" means that the MOS circuit group 3 is performing normal circuit operations, whereas the "standby state" means that the MOS circuit group 3 is not performing the normal circuit operations but it is waiting for the next normal circuit operations. For example, if the semiconductor integrated circuit according to this embodiment is mounted on an information terminal device, the semiconductor integrated circuit is in the standby state when a user has not operated the information terminal device for over a predetermined time.

The standby power supply voltage step down circuit 2 outputs a voltage lower than that of an output of the operating power supply voltage step down circuit 1. If the internal power supply voltage VDDint is lowered in the standby state, then a gate voltage corresponding to the internal power supply voltage VDDint is lowered. Therefore, as can be seen from the relation between the gate voltage and the gate leakage current shown in FIG. 6, the gate leakage current sharply reduces.

In this case, it can not be said that the lower the internal power supply voltage VDDint is, the better it is. There is a possibility that the excessively low internal power supply voltage VDDint exerts a bad influence on the operation of the MOS circuit group 3 to which the internal power supply voltage VDDint is supplied. In other words, when an SRAM memory cell or the like is provided in the MOS circuit group 3, there occurs a situation in which data are erased without being held unless a voltage higher than a given value is supplied. Accordingly, it is necessary to set the internal power supply voltage VDDint at such a low voltage as not exerts a bad influence on the operation of the MOS circuit group 3.

In the semiconductor integrated circuit shown in FIG. 1, the standby control signal STBY is at the low level in the operating state, and then the operating power supply voltage step down circuit 1 supplies the high internal power supply voltage VDDint to the internal power supply line IPL. That is, the internal power supply voltage VDDint supplied to the MOS circuit group 3 in the operating state is set at a high voltage required for the normal operation of the MOS circuit group 3. In the operating state, the standby power supply voltage step down circuit 2 also supplies the low internal power supply voltage VDDint to the internal power supply line IPL, but a current driving force of the operating power supply voltage step down circuit 1 is larger than that of the standby power supply voltage step down circuit 2, so that the voltage of the internal power supply line IPL remains at the high internal power supply voltage VDDint.

In the standby state, the standby control signal STBY is at the high level, and then the operating power supply voltage step down circuit 1 does not supply the high internal power supply voltage VDDint to the internal power supply line IPL. As a result of this, the voltage of the internal power supply line IPL remains at the low internal power supply voltage VDDint supplied by the standby power supply voltage step down circuit 2.

Figure 2A:
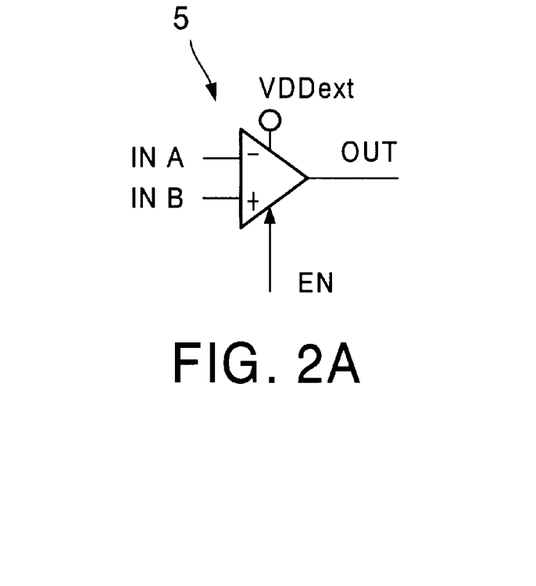
FIG. 2A is a circuit symbol diagram showing a first operational amplifier of the first embodiment.
Figure 2B:
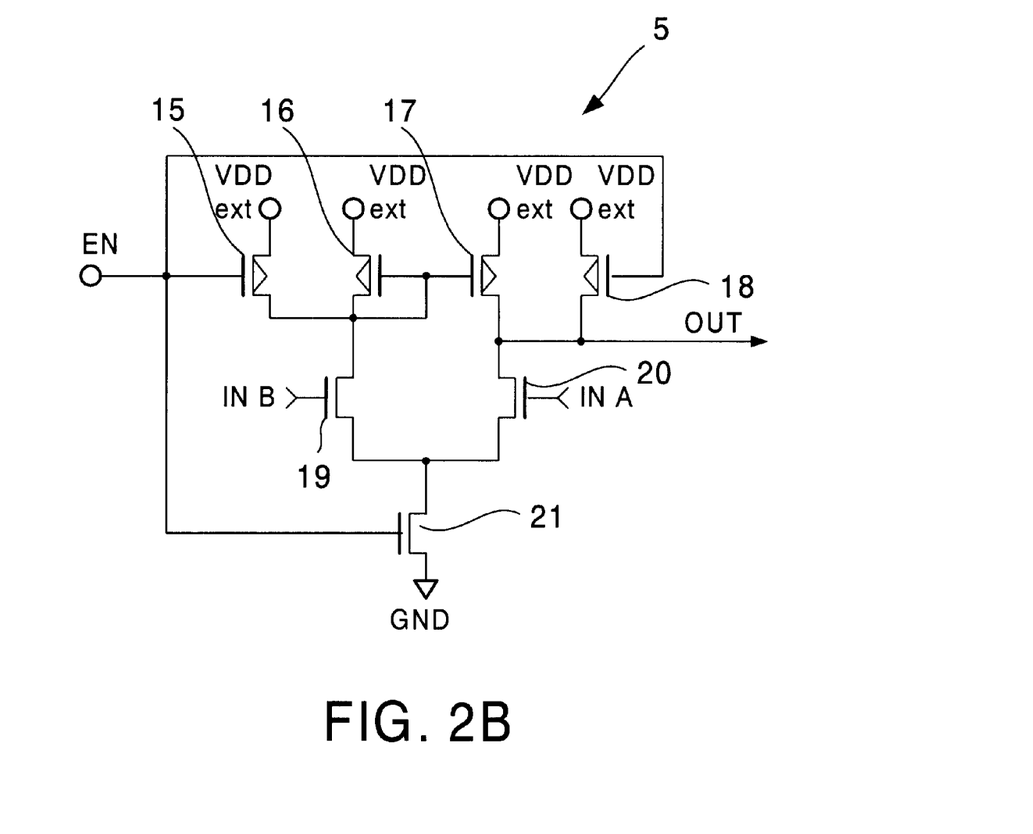
FIG. 2B is a circuit diagram showing the first operational amplifier of the first embodiment.
Figure 3A:
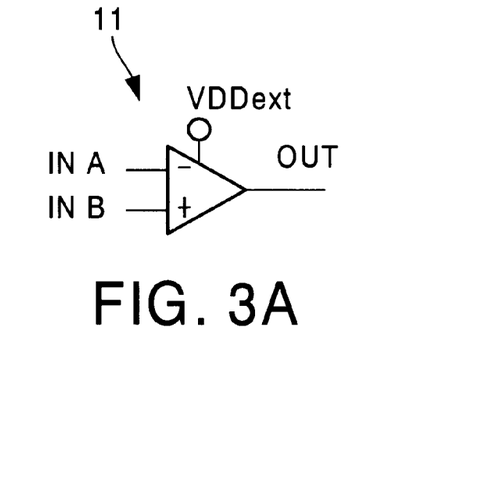
FIG. 3A is a circuit symbol diagram showing a second operational amplifier of the first embodiment.
Figure 3B:
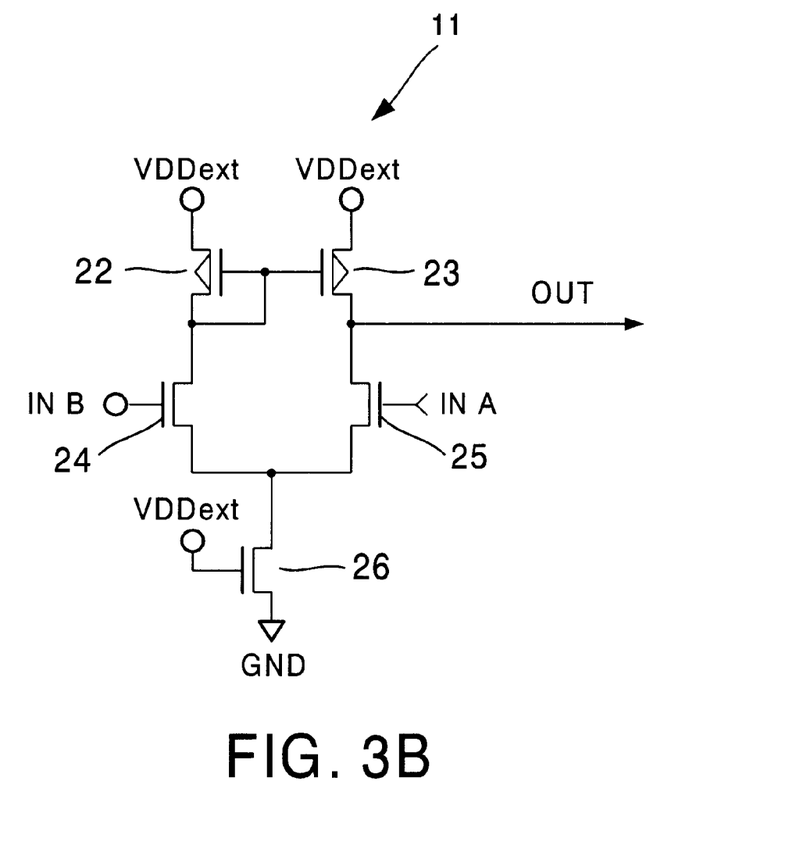
FIG. 3B is a circuit diagram showing the second operational amplifier of the first embodiment.

Next, concrete circuit structures of the first operational amplifier 5 and the second operational amplifier 11 will be explained. The first operational amplifier 5 used in the operating power supply voltage step down circuit 1 in FIG. 1 is configured, for example, as shown in FIG. 2A and FIG. 2B. The second operational amplifier 11 used in the standby power supply voltage step down circuit 2 is configured, for example, as shown in FIG. 3A and FIG. 3B.

As for the first operational amplifier 5, its input/output relation is shown in FIG. 2A. Specifically, the reference voltage VREF in FIG. 1 is shown as a signal INA, an output of the buffer 9 is shown as a signal EN, an input from an intermediate node between the two resistance elements 7 and 8 is shown as a signal INB, and an output to a gate of the first P-type MOS transistor 6 is shown as OUT.

FIG. 2B shows a concrete example of the circuit structure of the first operational amplifier 5 shown in FIG. 2A. More specifically, a drain and a gate of a fourth P-type MOS transistor 16 to whose source the external power supply voltage VDDext is inputted are connected to a drain of a third P-type MOS transistor 15 to whose gate the signal EN is inputted and to whose source the external power supply voltage VDDext is inputted.

A gate of a fifth P-type MOS transistor 17 is connected to the gate and the drain of the fourth P-type MOS transistor 16, and the external power supply voltage VDDext is inputted to a source of the fifth P-type MOS transistor 17.

A drain of a sixth P-type MOS transistor 18 is connected to a drain of the fifth P-type MOS transistor 17, the external power supply voltage VDDext is inputted to a source of the sixth P-type MOS transistor 18, and the signal EN is inputted to a gate thereof.

The drains of the fifth P-type MOS transistor 17 and the sixth P-type MOS transistor 18 function as an output node OUT of the first operational amplifier 5.

A drain of a first N-type MOS transistor 19 is connected to the drain of the third P-type MOS transistor 15, the drain and the gate of the fourth P-type MOS transistor 16, and the gate of the fifth P-type MOS transistor 17, and the signal INB is inputted to a gate of the first N-type MOS transistor 19.

A drain of a second N-type MOS transistor 20 is connected to the output node OUT, and the signal INA is inputted to a gate of the second N-type MOS transistor 20.

A drain of a third N-type MOS transistor 21 which is a current source transistor is connected to respective sources of the first N-type MOS transistor 19 and the second N-type MOS transistor 20. The signal EN is inputted to a gate of the third N-type MOS transistor 21, and a source of the N-type MOS transistor 21 is grounded.

As for the second operational amplifier 11, its input/output relation is shown in FIG. 3A. Specifically, the reference voltage VREFSTBY generated by the standby VREF generating circuit 10 in FIG. 1 is shown as a signal INA, the drain of the second P-type MOS transistor 12 is shown as a signal INB, and an output to a gate of the second P-type MOS transistor 12 is shown as a signal OUT.

FIG. 3B shows a concrete example of the circuit structure of the second operational amplifier 11 shown in FIG. 3A.

More specifically, a seventh P-type MOS transistor 22 and an eighth P-type MOS transistor 23 whose respective gates are connected to each other and to whose respective sources the external power supply voltage VDDext is inputted are provided.

The gate of the seventh P-type MOS transistor 22 and the gate of the eighth P-type MOS transistor 23 are connected to a drain of the seventh P-type MOS transistor 22. A drain of a fourth N-type MOS transistor 24 is connected to the drain of the seventh P-type MOS transistor 22.

The signal INB is inputted to a gate of the fourth N-type MOS transistor 24. A drain of the eighth P-type MOS transistor 23 functions as an output node OUT, to which a drain of a fifth N-type MOS transistor 25 is connected.

A source of the fourth N-type MOS transistor 24 and a source of the fifth N-type MOS transistor 25 are connected to each other, to both of which a drain of a sixth N-type MOS transistor 26 is connected.

The external power supply voltage VDDext is inputted to a gate of the sixth N-type MOS transistor 26 and a source of the N-type MOS transistor 26 is grounded.

Although both the first operational amplifier 5 shown in FIG. 2B and the second operational amplifier 11 shown in FIG. 3B are of a current mirror type, the first operational amplifier 5 shown in FIG. 2B has a structure in which it is activated when the operational amplifier activating signal EN is at the high level (the operating state), i.e. when the standby control signal STBY is at the low level. On the other hand, the first operational amplifier 5 is in an inactive state when the operational amplifier activating signal EN is at the low level (the standby state), i.e. when the standby control signal STBY is at high level. That is, when the operational amplifier activating signal EN is at the low level, the output OUT of the output node is pulled up to the external power supply voltage VDDext, and the third N-type MOS transistor 21 as the current source transistor is turned off, whereby a current passing therethrough is cut off. Moreover, the output OUT of the output node is at the external power supply voltage VDDext (the high level), so that the first P-type MOS transistor 6 in FIG. 1 is turned off, and then there is no power supply from the operating power supply voltage step down circuit 1 to the internal power supply line IPL.

As described above, in the first operational amplifier 5, the number of transistors connected to a positive regulator is relatively large, and the size of each transistor is set relatively large, whereby a larger quantity of current flows.

Meanwhile, in the second operational amplifier 11 shown in FIGS. 3A and 3B, the size of each transistor is set relatively small, whereby a heavy current does not flow easily.

According to this embodiment, a microstructural semiconductor integrated circuit capable of setting an internal power supply potential in the standby state at a voltage lower than a power supply potential in the operating state, thereby reducing a standby current due to a gate leakage.

Second Embodiment

The reference voltage generated by the standby VREF generating circuit 10 is the fixed and predetermined value in the above-mentioned first embodiment, on the other hand, the reference voltage generated by the standby VREF generating circuit is varied according to a variation of an amount of gate leakage current caused by its manufacturing process in a second embodiment. That is, the reference voltage is not fixed, and the voltage of the internal power supply voltage VDDint outputted by the standby power supply voltage step down circuit 2 in the standby state is also varied in the second embodiment.

A structure of a standby VREF generating circuit in a semiconductor integrated circuit according to the second embodiment will be explained by means of FIG. 4. In this embodiment, the general structure of the semiconductor integrated circuit is the same as that of FIG. 1 explained above, but a structure and an operation of the standby VREF generating circuit 10 is different from that of FIG. 1.

Figure 4:
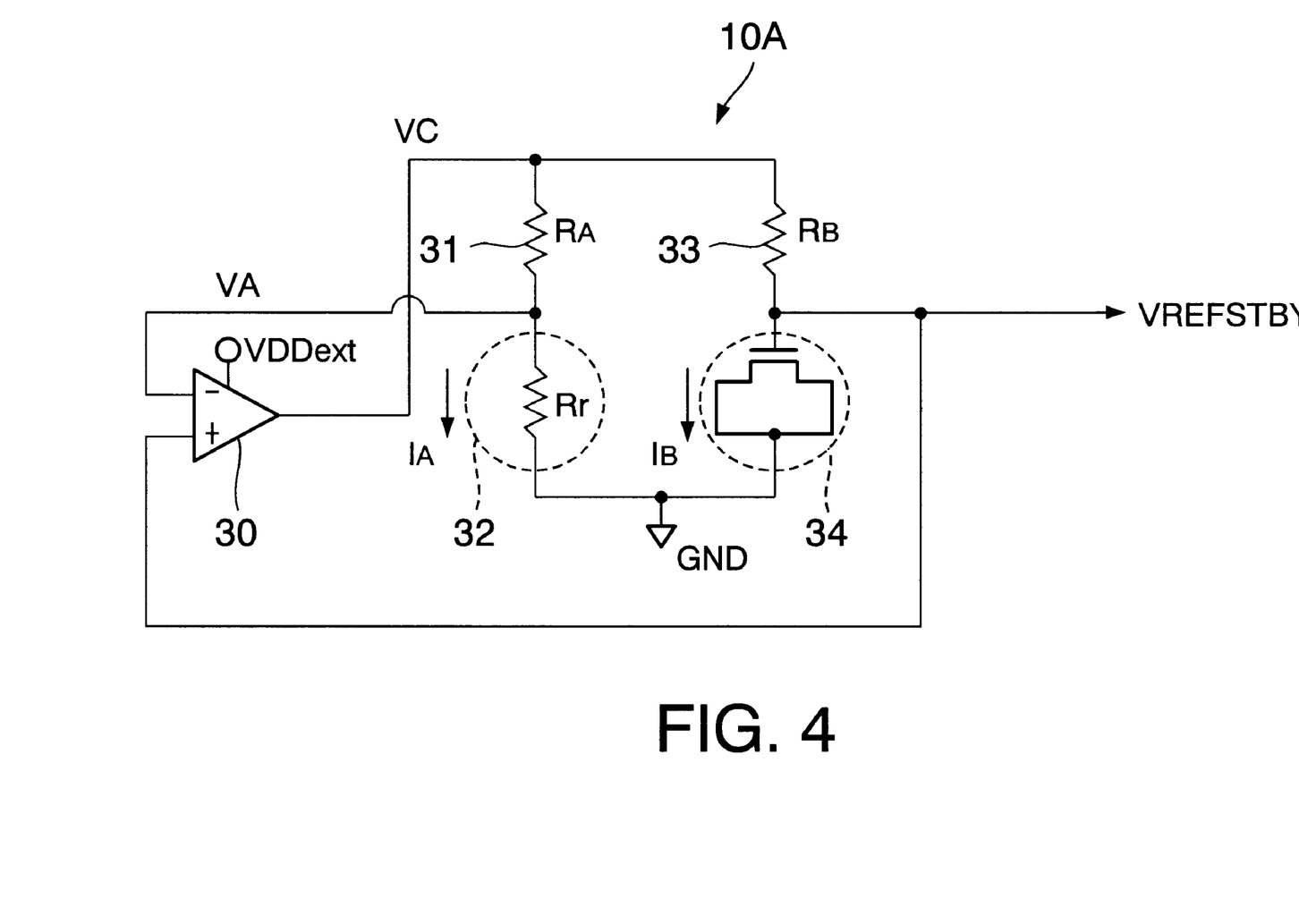
FIG. 4 is a circuit diagram of a standby VREF generating circuit of a second embodiment and a VREF generating circuit of a third embodiment.

In the standby VREF generating circuit 10A shown in FIG. 4, a third operational amplifier 30 is provided. The configuration of the third operational amplifier 30 is the same as that of the second operational amplifier 11. A connection node between a third resistance element RA31 and a fourth resistance element (reference resistance element Rr) 32, which are connected in series, is connected to a minus input terminal of the third operational amplifier 30. That is, the node between the third resistance element RA31 and the forth resistance element Rr32 serves as a comparative node, which outputs a comparative voltage VA. An output VC of the third operational amplifier 30 is inputted to one end of the third resistance element RA31.

The output VC of the third operational amplifier 30 is also connected to one end of a fifth resistance element RB33. The resistance value of the fifth resistance element RB33 is set equally to the resistance value of the third resistance element RA31.

The other end of the fifth resistance element RB33 serves as an output node from which the standby VREF generating circuit outputs the reference voltage VREFSTBY. The other end of the fifth resistance element RB33 is connected to a gate of a dummy MOS capacitor 34 for monitoring a gate leakage. The dummy MOS capacitor 34 for monitoring the gate leakage is formed of a MOS transistor which has the same structure as a MOS transistor in the MOS circuit group 3. A source and a drain of the MOS transistor are connected to each other in order to constitutes the MOS capacitor 34. The source and the drain of dummy MOS capacitor 34 for monitoring the gate leakage are connected to the other end of the fourth resistance element (reference resistance element Rr) 32 and further grounded. As a result of this, an amount of gate leakage currents of the MOS transistors in the MOS circuit group 3 can be estimated in accordance with an amount of a gate leakage current of the MOS capacitor 34.

Moreover, the reference voltage VREFSTBY is applied to a plus input terminal of the third operational amplifier 30.

This standby VREF generating circuit 10A has the function of generating a gate voltage of the dummy MOS capacitor 34 when the resistance values of the dummy MOS capacitor 34 and the reference resistance element Rr32 are equal, as the reference voltage VREFSTBY.

The output VC of the third operational amplifier 30 is subjected here to feedback control by the operational amplifier 30 in such a manner that the comparative voltage VA inputted to the minus input terminal of the third operational amplifier 30 and the reference voltage VREFSTBY inputted to the plus input terminal thereof have the same potential. Since the resistance value of the third resistance element RA31 and the resistance value of the fifth resistance element RB33 are the same, when the comparative voltage VA and the reference voltage VREFSTBY have the same potential, a current IA flowing through the reference resistance element Rr32 and a current IB flowing through the dummy MOS capacitor 34 have the same value, and hence the resistance values of the reference resistance Rr32 and the dummy MOS capacitor 34 become equal.

Suppose here that the gate area of the entire chip is 100 K$\mu$m$^2$, and that the area of the dummy MOS capacitor 34 is 1 K $\mu$m$^2$. Assuming that the gate leakage current is proportional to the gate area, when the allowable gate leakage current of the entire chip in the standby state is 10 $\mu$A, the allowable leakage current in the dummy MOS capacitor 34 is 0.1 $\mu$A.

Accordingly, if the reference resistance Rr32 in FIG. 4 is set at approximately 10 M$\Omega$ which corresponds to the capability of supplying a current of 0.1 $\mu$A, the reference voltage VREFSTBY is set so that the ununiformity of processes in respective chips is compensated. Namely, the reference voltage VREFSTBY is set so that the gate leakage current of the dummy MOS capacitor 34 always has a fixed value of 0.1 $\mu$A. On this occasion, in the entire chip, the potential of the reference voltage VREFSTBY is supplied as the internal power supply voltage VDDint, and hence the gate leakage current is maintained at a fixed value of 10 $\mu$A.

Assuming here that the gate area of the dummy MOS capacitor 34 is one thousandth of the gate area of the entire chip, a current flowing through both the reference resistance element Rr32 and the dummy MOS capacitor 34 is one thousandth of a current flowing through gates of the entire chip.

Incidentally, the reference resistance element Rr32 has an ohmic characteristic, while the dummy MOS capacitor 34 has a non-ohmic characteristic. Because of this characteristic difference, concerning the comparative voltage VA at the connection node between the reference resistance element Rr32 and the third resistance element RA31 and the reference voltage VREFSTBY at the connection node of the gate of the dummy MOS capacitor 34 and the fifth resistance element RB33, the voltage output VC at which the comparative voltage VA and the reference voltage VREFSTBY are equal are selected and set by the third operational amplifier 30.

As a result of this, in a case where the amount of the gate leakage current flowing through the dummy MOS capacitor 34 is large, the voltage of the reference voltage VREFSTBY becomes low, whereas, in a case where the amount of the gate leakage current flowing through the dummy MOS capacitor 34 is small, the voltage of the reference voltage becomes high. If the reference voltage VREFSTBY becomes low, the voltage of the internal power supply voltage VDDint outputted to the internal power supply line IPL by the standby power supply voltage step down circuit 2 also becomes low, whereas, if the reference voltage VREFSTBY becomes high, the voltage of the internal power supply voltage VDDint outputted to the internal power supply line IPL by the standby power supply voltage step down circuit 2 also becomes high. Therefore, the amount of the gate leakage currents flowing in the MOS circuit group 3 is estimated from the gate leakage current flowing through the dummy MOS capacitor 34, and then the voltage of the internal power supply voltage VDDint outputted to the internal power supply line IPL by the standby power supply voltage step down circuit 2 can be set low when the amount of the gate leakage currents flowing in the MOS circuit group 3 is likely to be large, while the voltage of the internal power supply voltage VDDint outputted to the internal power supply line IPL by the standby power supply voltage step down circuit 2 can be set high when the amount of the gate leakage currents flowing in the MOS circuit group 3 is likely to be small. In other words, the amount of the gate leakage currents flowing in the MOS circuit group 3 is estimated, and then the internal power supply voltage can be set lower as the amount of the estimated gate leakage current becomes large.

In the semiconductor integrated circuit according to the embodiment, since the gate leakage current per unit gate area is 0.1 nA, the reference voltage VREFSTBY which is the setting voltage for the internal power supply voltage VDDint is maintained at approximately 0.8 V. Namely, in this embodiment, the internal power supply voltage VDDint, which is 1.2 V in the operating state, s dropped to 0.8 V in the standby state to reduce the gate leakage currents.

Third Embodiment

In the third embodiment, by applying the standby VREF generating circuit 10A to an operating VREF generating circuit, the internal power supply voltage VDDint in the operating state is controlled on the basis of the amount of the gate leakage current of the dummy MOS capacitor 34. More detailed explanation will be made hereinafter.

Figure 8:
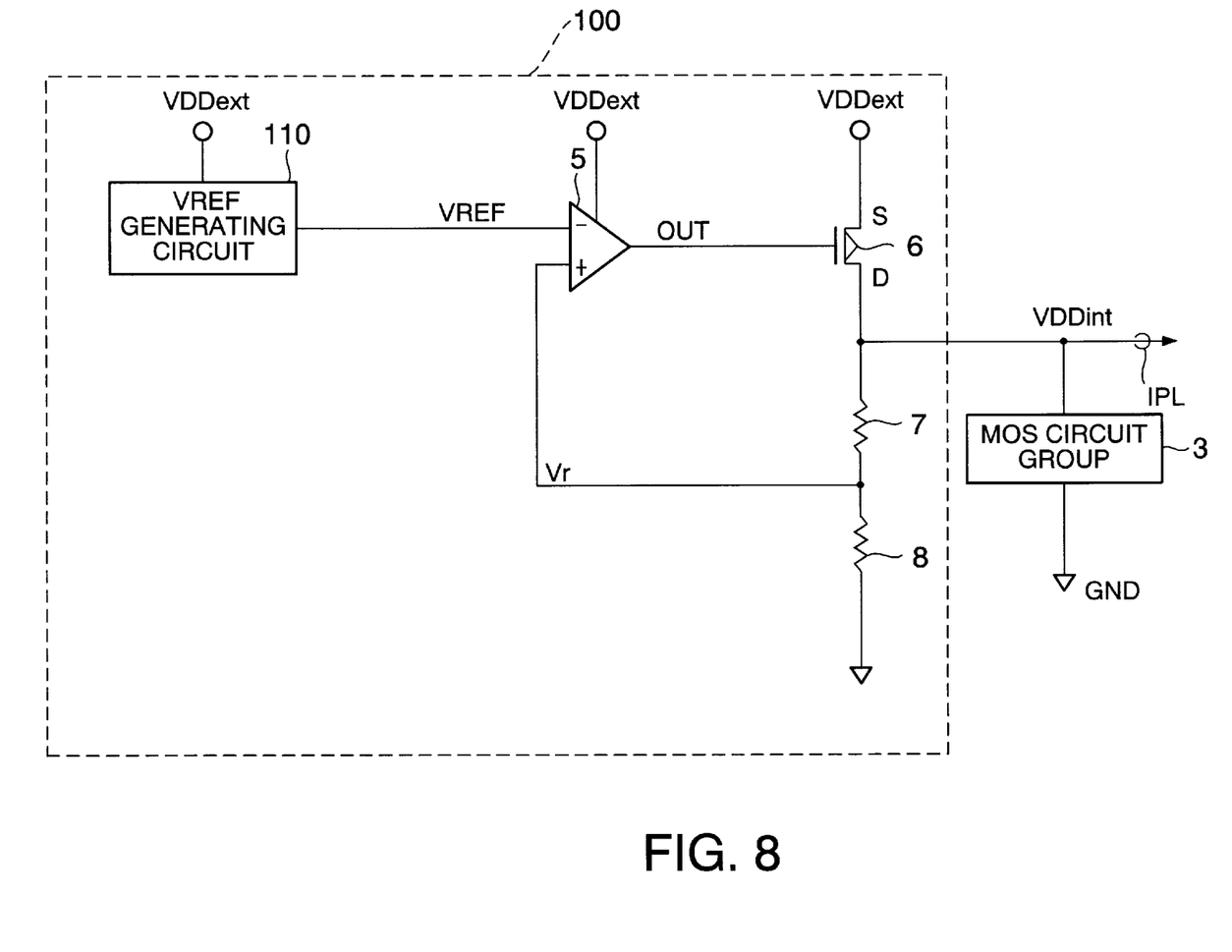
FIG. 8 is a circuit diagram showing a semiconductor integrated circuit of the third embodiment.

FIG. 8 is a diagram showing a structure of a semiconductor integrated circuit according to this embodiment. As shown in FIG. 8, the semiconductor integrated circuit according to this embodiment has the structure that the standby power supply voltage step down circuit 2 is omitted from the aforesaid structure in FIG. 1 and it has a power supply voltage step down circuit 100 which serves in both the operating state and the standby state.

Moreover, the power supply voltage step down circuit 100 has the standby VREF generating circuit 10A shown in FIG. 4, as a VREF generating circuit 110. The VREF generating circuit 110 outputs a reference voltage VREF instead of the reference voltage VREFSTBY in accordance with the amount of the gate leakage current of the dummy MOS capacitor 34. That is, the reference voltage VREF is changed according to the ununiformity of the gate leakage current of the dummy MOS capacitor 34 due to the manufacturing process.

More specifically, the reference voltage VREF is low when the amount of the gate leakage current of the MOS capacitor 34 is large, while the reference voltage VREF is high when the amount of the gate leakage current of the MOS capacitor 34 is small. As shown in FIG. 8, the reference voltage VREF is inputted to the minus input terminal of the operational amplifier 5.

A voltage Vr is inputted to the plus input terminal of the operational amplifier 5, the voltage Vr is obtained by resistively dividing the internal power supply voltage VDDint by the first resistance element 7 and the second resistance element 8. As a result, feedback control is carried out in order that the voltage Vr and the reference voltage VREF are equal.

In a case where the reference voltage VREF is lowered, the output OUT of the operational amplifier 5 is heightened to reduce a current flowing from the source to the drain of the P-type MOS transistor 6. Therefore, the voltage of the internal power supply voltage VDDint outputted to the internal power supply line IPL by the power supply voltage step down circuit 100 is lowered. That is, the voltage of the internal power supply voltage VDDint is lowered, so that it is possible to reduce the gate leakage currents flowing through the MOS transistors within the MOS circuit group 3.

On the other hand, in a case where the reference voltage VREF is heightened, the output OUT of the operational amplifier 5 is lowered to increase the current flowing from the source to the drain of the P-type MOS transistor 6. Therefore, the voltage of the internal power supply voltage VDDint outputted to the internal power supply line IPL by the power supply voltage step down circuit 100 is heightened. In this manner, although the voltage of the internal power supply voltage VDDint supplied to the MOS circuit group 3 is heightened, the gate leakage currents of the MOS transistors within the MOS circuits group 3 do not become so large, and hence the total amount of the gate leakage currents within the entire semiconductor integrated circuit does not become so large.

Because, the amount of the gate leakage currents is ununiform due to the manufacturing process, but tendencies of the amount of the gate leakage currents are almost even with one another among MOS transistors in one semiconductor integrated circuit. Therefore, when there is a tendency f or the gate leakage current of the dummy MOS capacitor 34 to be large, it is assumed that the MOS transistors in the MOS circuit group 3 have the same tendencies, so that the voltage of the internal power supply voltage VDDint supplied to the MOS circuit group 3 is lowered so as to reduce the amount of the gate leakage currents. On the other hand, when there is a tendency for the gate leakage current of the dummy MOS capacitor 34 to be small, it is assumed that the MOS transistors in the MOS circuit group 3 have the same tendencies, so that the voltage of the internal power supply voltage VDDint supplied to the MOS circuit group 3 can be heightened.

In this way, according to the semiconductor integrated circuit of this embodiment, the total amount of the gate leakage currents in the MOS circuit group 3 can be maintained approximately at constant value in the operating state without influence of the ununiformity of manufacturing process. That is, it is possible to compensate for the ununiformity of manufacturing process among the semiconductor tips including the semiconductor integrated circuits, and hence it is possible to provide an LIS of which current consumption is small.

The semiconductor integrated circuit according to this embodiment is particularly suitable for a field in which the ratio of the gate leakage currents to the total current consumption in the operating state is large and the small current consumption is more important than operating speed.

According to the embodiments mentioned above, the semiconductor integrated circuit which compensates f or the ununiformity of processes in respective chips and reduces the gate leakage currents of the entire chip in the standby state and/or in the operating state can be provided.

What is claimed is:

1. A semiconductor integrated circuit comprising:
    a power supply voltage step down circuit which is supplied with a power supply voltage and controlled by a standby control signal indicating an operating state or a standby state, wherein the power supply voltage step down circuit outputs a first internal power supply voltage lower than the power supply voltage to an internal power supply line when the standby control signal indicates the operating state, and the power supply voltage step down circuit outputs a second internal power supply voltage lower than the first internal power supply voltage to the internal power supply line when the standby control signal indicates the standby state; and
    a MOS circuit group including one or more MOS transistors which are supplied with the first internal power supply voltage or the second internal power supply voltage from the internal power supply line to operate, wherein the power supply voltage step down circuit comprises:

an operating power supply voltage step down circuit which generates the first internal power supply voltage to output it to the internal power supply line in the operating state, but which does not output the first internal power supply voltage in the standby state; and a standby power supply voltage step down circuit which generates the second internal power supply voltage to output it to the internal power supply line in the standby state, wherein the second internal power supply voltage is not a fixed predetermined voltage, and wherein the standby power supply voltage step down circuit estimates an amount of gate leakage currents flowing in the MOS circuit group and lowers the second internal power supply voltage as the estimated amount of the gate leakage currents becomes large.

2. A semiconductor integrated circuit comprising:

a power supply voltage step down circuit which is supplied with a power supply voltage and controlled by a standby control signal indicating an operating state or a standby state, wherein the power supply voltage step down circuit outputs a first internal power supply voltage lower than the power supply voltage to an internal power supply line when the standby control signal indicates the operating state, and the power supply voltage step down circuit outputs a second internal power supply voltage lower than the first internal power supply voltage to the internal power supply line when the standby control signal indicates the standby state; and a MOS circuit group including one or more MOS transistors which are supplied with the first internal power supply voltage or the second internal power supply voltage from the internal power supply line to operate, wherein the power supply voltage step down circuit comprises:

an operating power supply voltage step down circuit which generates the first internal power supply voltage to output it to the internal power supply line in the operating state, but which does not output the first internal power supply voltage in the standby state; and a standby power supply voltage step down circuit which generates the second internal power supply voltage to output it to the internal power supply line in the standby state, wherein the second internal power supply voltage is not a fixed predetermined voltage, wherein the standby power supply voltage step down circuit generates the second internal power supply voltage to output it to the internal power supply line also in the operating state, and a current driving force of the operating power supply voltage step down circuit is larger than that of the standby power supply voltage step down circuit, and wherein the standby power supply voltage step down circuit estimates an amount of gate leakage currents flowing in the MOS circuit group and lowers the second internal power supply voltage as the estimated amount of the gate leakage currents becomes large.

3. The semiconductor integrated circuit as set forth in claim 2, wherein the standby power supply voltage step down circuit comprises:

a reference voltage generating circuit which generates a reference voltage which is varied according to the estimated amount of the gate leakage currents; and a control circuit which performs feedback control in order that the voltage of the internal power supply line is equal to the reference voltage.

4. The semiconductor integrated circuit as set forth in claim 3, wherein the reference voltage generating circuit comprises a dummy MOS transistor of which a source and of which a drain are connected to each other, and the reference voltage generating circuit varies the reference voltage according to an amount of a gate leakage current flowing from a gate of the dummy MOS transistor to the source and the drain of the dummy MOS transistor.

5. The semiconductor integrated circuit as set forth in claim 4, wherein the reference voltage generating circuit comprises:

a first resistance element, one end of which is connected to the gate of the dummy MOS transistor, wherein a node between the one end of the first resistance element and the gate of the dummy MOS transistor serves as an output node which outputs the reference voltage;

a second resistance element, one end of which is connected to the other end of the first resistance element;

a third resistance element, one end of which is connected to the other end of the second resistance element, and the other end of which is connected to the source and the drain of the dummy MOS transistor, wherein a node between the one end of the third resistance element and the other end of the second resistance element serves as a comparative node which outputs a comparative voltage; and a comparative supply circuit which compares the reference voltage of the output node with the comparative voltage of the comparative node and which supplies a voltage to the other end of the first resistance element and the one end of the second resistance element in order that the reference voltage is equal to the comparative voltage.

6. The semiconductor integrated circuit as set forth in claim 5, a resistance value of the first resistance element is equal to a resistance value of the second resistance element.

7. A semiconductor integrated circuit comprising:

a power supply voltage step down circuit which is supplied with a power supply voltage and controlled by a standby control signal indicating an operating state or a standby state, wherein the power supply voltage step down circuit outputs a first internal power supply voltage lower than the power supply voltage to an internal power supply line when the standby control signal indicates the operating state, and the power supply voltage step down circuit outputs a second internal power supply voltage lower than the first internal power supply voltage to the internal power supply line when the standby control signal indicates the standby state; and a MOS circuit group including one or more MOS transistors which are supplied with the first internal power supply voltage or the second internal power supply voltage from the internal power supply line to operate, wherein the power supply voltage step down circuit estimates an amount of gate leakage currents flowing in the MOS circuit group and the second internal power supply voltage is decided in accordance with the estimated amount of the gate leakage currents.

8. The semiconductor integrated circuit as set forth in claim 7, wherein the power supply voltage step down circuit comprises:

an operating power supply voltage step down circuit which generates the first internal power supply voltage to output it to the internal power supply line in the operating state, but which does not output the first internal power supply voltage in the standby state; and a standby power supply voltage step down circuit which generates the second internal power supply voltage to output it to the internal power supply line in the standby state.

9. The semiconductor integrated circuit as set forth in claim 8, wherein the standby power supply voltage step down circuit estimates an amount of gate leakage currents flowing in the MOS circuit group and lowers the second internal power supply voltage as the estimated amount of the gate leakage currents becomes large.

10. The semiconductor integrated circuit as set forth in claim 8, wherein the standby power supply voltage step down circuit generates the second internal power supply voltage to output it to the internal power supply line also in the operating state, and a current driving force of the operating power supply voltage step down circuit is larger than that of the standby power supply voltage step down circuit.

11. The semiconductor integrated circuit as set forth in claim 10, wherein the standby power supply voltage step down circuit estimates an amount of gate leakage currents flowing in the MOS circuit group and lowers the second internal power supply voltage as the estimated amount of the gate leakage currents becomes large.

12. The semiconductor integrated circuit as set forth in claim 11, wherein the standby power supply voltage step down circuit comprises:

a reference voltage generating circuit which generates a reference voltage which is varied according to the estimated amount of the gate leakage currents; and a control circuit which performs feedback control in order that the voltage of the internal power supply line is equal to the reference voltage.

13. The semiconductor integrated circuit as set forth in claim 12, wherein the reference voltage generating circuit comprises a dummy MOS transistor of which a source and of which a drain are connected to each other, and the reference voltage generating circuit varies the reference voltage according to an amount of a gate leakage current flowing from a gate of the dummy MOS transistor to the source and the drain of the dummy MOS transistor.

14. The semiconductor integrated circuit as set forth in claim 13, wherein the reference voltage generating circuit comprises:

a first resistance element, one end of which is connected to the gate of the dummy MOS transistor, wherein a node between the one end of the first resistance element and the gate of the dummy MOS transistor serves as an output node which outputs the reference voltage;

a second resistance element, one end of which is connected to the other end of the first resistance element;

a third resistance element, one end of which is connected to the other end of the second resistance element, and the other end of which is connected to the source and the drain of the dummy MOS transistor, wherein a node between the one end of the third resistance element and the other end of the second resistance element serves as a comparative node which outputs a comparative voltage; and a comparative supply circuit which compares the reference voltage of the output node with the comparative voltage of the comparative node and which supplies a voltage to the other end of the first resistance element and the one end of the second resistance element in order that the reference voltage is equal to the comparative voltage.

15. The semiconductor integrated circuit as set forth in claim 14, a resistance value of the first resistance element is equal to a resistance value of the second resistance element.

* * * * *